(12) United States Patent
Moreno et al.

(10) Patent No.: US 11,119,127 B2
(45) Date of Patent: Sep. 14, 2021

(54) METHOD AND APPARATUS FOR NON-INTRUSIVE PROGRAM TRACING WITH BANDWIDTH REDUCTION FOR EMBEDDED COMPUTING SYSTEMS

(71) Applicants: Carlos Moreno, Waterloo (CA); Sebastian Fischmeister, Waterloo (CA)

(72) Inventors: Carlos Moreno, Waterloo (CA); Sebastian Fischmeister, Waterloo (CA)

(*) Notice: Subject to any disclaimer, the term of this patent is extended or adjusted under 35 U.S.C. 154(b) by 302 days.

(21) Appl. No.: 16/051,574

(22) Filed: Aug. 1, 2018

(65) Prior Publication Data

US 2019/0041434 A1 Feb. 7, 2019

Related U.S. Application Data

(60) Provisional application No. 62/539,820, filed on Aug. 1, 2017.

(51) Int. Cl.
*G01R 19/25* (2006.01)
*G01R 29/08* (2006.01)
*G06K 9/00* (2006.01)

(52) U.S. Cl.
CPC ..... *G01R 19/2509* (2013.01); *G01R 19/2513* (2013.01); *G01R 29/0892* (2013.01); *G06K 9/0053* (2013.01); *G06K 9/00536* (2013.01)

(58) Field of Classification Search
CPC ............ G01R 19/2509; G01R 19/2513; G01R 29/0892; G06K 9/0053; G06K 9/00536
See application file for complete search history.

(56) References Cited

U.S. PATENT DOCUMENTS

| 5,659,312 A | 8/1997 | Sunter et al. |
| 5,778,030 A | 7/1998 | Bruckert et al. |
| 6,342,350 B1 | 1/2002 | Tanzi et al. |

(Continued)

OTHER PUBLICATIONS

Kocher P., Jaffe J., Jun B. (1999) Differential Power Analysis. In: Wiener M. (eds) Advances in Cryptology—CRYPTO' 99. CRYPTO 1999. Lecture Notes in Computer Science, vol. 1666. Springer, Berlin, Heidelberg. https://doi.org/10.1007/3-540-48405-1_25 (10 pages).

(Continued)

*Primary Examiner* — Bryan Bui
(74) *Attorney, Agent, or Firm* — BERESKIN & PARR LLP/S.E.N.C.R.L., s.r.l.

(57) ABSTRACT

Systems and methods for non-intrusive program tracing of a device are disclosed. The methods involve generating a program trace signal from at least one of power consumption and electromagnetic emission of the device; digitizing and decomposing the program trace signal into at least two digital program trace component signals including a low frequency program trace component and one or more high frequency program trace component signals; classifying fragments of the at least two digital program trace component signals of the program trace signal as at least one of a known portion of program code and an observed behavior of the device. Each of the at least two digital program trace component signals have different frequency bands and the bandwidth of each program trace component signal is smaller than the bandwidth of the program trace signal. Each of the high frequency program trace component signals include an envelope.

18 Claims, 9 Drawing Sheets

(56) References Cited

U.S. PATENT DOCUMENTS

| | | | |
|---|---|---|---|
| 6,469,049 B1 | 10/2002 | Meyerhoff et al. | |
| 6,620,621 B1 | 9/2003 | Cohenford et al. | |
| 7,188,258 B1 | 3/2007 | Aggarwal et al. | |
| 8,522,052 B1 | 8/2013 | Lesea | |
| 8,548,219 B2 | 10/2013 | Ortyn et al. | |
| 8,892,903 B1 | 11/2014 | Trimberger | |
| 9,430,644 B2* | 8/2016 | Aguayo Gonzalez | G06F 21/554 |
| 9,444,618 B1 | 9/2016 | Trimberger et al. | |
| 10,007,786 B1* | 6/2018 | Bhatkar | G06N 20/00 |
| 10,264,440 B2 | 4/2019 | Dishon et al. | |
| 10,395,032 B2 | 8/2019 | Keller et al. | |
| 10,430,263 B2 | 10/2019 | Polar Seminario | |
| 2003/0160154 A1 | 8/2003 | Arnold et al. | |
| 2004/0078690 A1* | 4/2004 | Kohashi | G06F 11/3466 714/38.1 |
| 2007/0258898 A1 | 11/2007 | Ballinger et al. | |
| 2008/0021834 A1 | 1/2008 | Holla et al. | |
| 2008/0113872 A1 | 5/2008 | Schuren et al. | |
| 2009/0012387 A1 | 1/2009 | Hanson et al. | |
| 2010/0104191 A1 | 4/2010 | McGwire | |
| 2010/0237854 A1 | 9/2010 | Kumhyr et al. | |
| 2010/0281309 A1 | 11/2010 | Laurenti et al. | |
| 2010/0313270 A1 | 12/2010 | Kim et al. | |
| 2011/0234307 A1 | 9/2011 | Marinet et al. | |
| 2012/0029336 A1 | 2/2012 | Terada et al. | |
| 2012/0244145 A1 | 9/2012 | Sampson et al. | |
| 2012/0265487 A1 | 10/2012 | Yanine et al. | |
| 2013/0024382 A1 | 1/2013 | Dala et al. | |
| 2014/0167704 A1 | 6/2014 | Lafontaine et al. | |
| 2014/0334653 A1 | 11/2014 | Luna et al. | |
| 2014/0335043 A1 | 11/2014 | Chon et al. | |
| 2014/0371081 A1 | 12/2014 | Badve et al. | |
| 2015/0097729 A1 | 4/2015 | Subburaj et al. | |
| 2015/0279648 A1 | 10/2015 | Furtaw et al. | |
| 2015/0317475 A1* | 11/2015 | Aguayo Gonzalez | G06F 21/55 726/23 |
| 2015/0381364 A1 | 12/2015 | Al-Somani | |
| 2016/0041574 A1 | 2/2016 | Maitani et al. | |
| 2016/0117503 A1 | 4/2016 | Reed et al. | |
| 2017/0060175 A1 | 3/2017 | Waugh | |
| 2017/0080249 A1 | 3/2017 | Brawn et al. | |
| 2017/0111069 A1 | 4/2017 | Dafesh et al. | |
| 2017/0149572 A1 | 5/2017 | Wallrabenstein | |
| 2017/0234979 A1 | 8/2017 | Mathews et al. | |
| 2017/0351848 A1 | 12/2017 | Bakish | |
| 2018/0137270 A1 | 5/2018 | Moreno et al. | |
| 2018/0299464 A1 | 10/2018 | Li et al. | |

OTHER PUBLICATIONS

Carlos Moreno, Sebastian Fischmeister, and M. Anwar Hasan: Non-Intrusive Program Tracing and Debugging of Deployed Embedded Systems Through Side-Channel Analysis. LCTES (2013) (11 pages).

Eisenbarth et al. Building a Side Channel Based Disassembler. M.L. Gavrilova et al. (Eds.): Trans. on Comput. Sci. X, LNCS 6340, pp. 78-99, 2010.

Shane S. Clark et al.: WattsUpDoc: Power Side Channels to Nonintrusively Discover Untargeted Malware on Embedded Medical Devices. USENIX Workshop on Health Information Technologies (2013) (11 pages).

Mehari Msgna, Konstantinos Markantonakis, and Keith Mayes: The B-side of side channel leakage: control flow security in embedded systems. T. Zia et al. (Eds.): SecureComm 2013, LNICST 127, pp. 288-304, 2013.

Liu et al.: On Code Execution Tracking via Power Side-Channel. CCS (2016), Oct. 24-28, Vienna, Austria (13 pages).

Callan, R., Zajić, A. and Prvulovic, M. Fase: finding amplitude-modulated side-channel emanations. In 2015 ACM/IEEE 42nd Annual International Symposium on Computer Architecture (ISCA) Jun. 2015. (pp. 592-603). IEEE.

Belgarric, P., Bhasin, S., Bruneau, N., Danger, J.L., Debande, N., Guilley, S., Heuser, A., Najm, Z. and Rioul, O. Time-frequency analysis for second-order attacks. In International Conference on Smart Card Research and Advanced Applications, Springer, Cham, Nov. 2013. (pp. 108-122).

* cited by examiner

METHOD AND APPARATUS FOR NON-INTRUSIVE PROGRAM TRACING WITH BANDWIDTH REDUCTION FOR EMBEDDED COMPUTING SYSTEMS

PRIORITY

This application claims the benefit of U.S. Provisional Patent Application No. 62/539,820, filed Aug. 1, 2017, which is incorporated herein by reference in its entirety.

FIELD

The embodiments described herein relate to the field of embedded computing systems, and in particular, side-channel analysis of embedded computing systems for security, safety, and development.

BACKGROUND

Security and safety can be essential aspects of embedded computing systems, especially safety-critical systems, and in view of the ever-increasing connectivity of such systems. Traditionally, safety-critical systems have used runtime monitoring techniques to enforce security and safety properties during operation. However, monitoring security and safety properties poses unique challenges. The functionality of safety-critical systems should not be disrupted by such monitoring. In addition, firmware reprogramming can bypass a monitoring tool if it runs alongside the monitored and vulnerable system. Furthermore, if malware runs on the same processor as the monitoring tool, then malware can "fake" behaviors that the monitoring tool will consider acceptable.

In addition, debugging can be a difficult aspect of embedded software development, particularly at the production or deployment stage. By the time that faults are observed at the production or deployment stage, tools for debugging are limited. Typically, auxiliary components that can aid debugging have been removed from the software prior to production or deployment and cannot be added back in.

Some existing security and safety monitoring and debugging techniques are based on side-channel analysis, that is, correlating instructions that a microprocessor is executing with side-effects of the microprocessor during execution, such as power consumption and electromagnetic emissions. Reconstructing program traces in these techniques can involve standard statistical pattern recognition techniques, hidden Markov models, or signal processing approaches including ideas from the pattern recognition field. Such data processing is typically performed offline and "manually" by an operator.

SUMMARY

In a first aspect, there is a system for non-intrusive program tracing of a device. In at least one embodiment, the system includes: a detector operable to generate a program trace signal from at least one of power consumption and electromagnetic emission of the device; a decomposer operable to decompose the program trace signal into at least two program trace component signals; a converter operable to digitize the program trace signal; and a processor operable to classify fragments of at least two digital program trace component signals of the program trace signal as at least one of a known portion of program code and an observed behavior of the device. The program trace signal includes an analog signal having a bandwidth. Each of the at least two program trace component signals have different frequency bands. The at least two program trace component signals include a low frequency program trace component signal and one or more high frequency program trace component signals. The bandwidth of each program trace component signal is smaller than the bandwidth of the program trace signal. Each of the one or more high frequency program trace component signals include an envelope of the program trace signal within the frequency band of that high frequency program trace component signal. The at least two digital program trace component signals include the program trace signal decomposed by the decomposer and digitized by the converter.

In some aspects, the decomposer decomposes the program trace signal into at least two analog program trace component signals; and the converter digitizes the at least two analog program trace component signals to provide the at least two digital program trace component signals.

In some aspects, the converter digitizes the program trace signal into a digital program trace signal; and the decomposer decomposes the digital program trace signal to provide the at least two digital program trace component signals.

In some aspects, the system can further include a database for storing a plurality of candidate samples and a comparator. Each candidate sample is associated with at least one of the known portion of program code and an observed behavior. Each candidate sample including at least two candidate sample components having different frequency bands that correspond to the different frequency bands of the at least two program trace component signals. The comparator can collect the fragments and to determine a distance between a program trace signal and at least one candidate sample. The distance between the program trace signal and the at least one candidate sample includes the distances between program trace component signals of the program trace signal and the candidate sample components of the at least one candidate sample having the same frequency bands. The processor can determines if the distance between the fragment and at least one of the candidate samples satisfies a pre-determined criterion and classify the fragment as one of the candidate samples based on whether the pre-determined criterion is satisfied.

In some aspects, the database can store the at least two candidate sample components of each candidate sample.

In some aspects, the decomposer can be further configured to digitize the plurality of candidate samples to provide the at least two candidate sample components of each candidate sample In some aspects, the frequency band of the low frequency program trace component signal is defined by at least a first pre-determined frequency; a frequency band of the one or more high frequency program trace component signals is defined by at least a second pre-determined frequency; and the decomposer includes a first low pass filter, a high pass filter, and a first envelope processor. The first low pass filter can generate the low frequency program trace component signal from the program trace signal, the low frequency program trace component signal having frequencies below the first pre-determined frequency threshold. The high pass filter can generate a first intermediate program trace component signal from the program trace signal, the first intermediate program trace component signal having frequencies above the second pre-determined frequency threshold. The first envelope processor can generate a first high frequency program trace component signal, the first high frequency program trace component signal including an envelope of the first intermediate program trace component signal.

In some aspects, the first envelope processor can include a rectifier and at least one of a group comprising a second low pass filter having the second pre-determined frequency threshold, an envelope detector, and a root-mean-square (RMS) detector.

In some aspects, the at least two program trace component signals further include a second high frequency program trace component signal having a second high frequency band. The second high frequency band can be defined by at least a third pre-determined frequency and either the first pre-determined frequency or the second pre-determined frequency. The decomposer can further include either a third low pass filter or a second high pass filter for generating a second intermediate program trace component signal from either the low frequency program trace component signal when the second high frequency band is defined by the first pre-determined frequency, or the first intermediate program trace component signal when the second high frequency band is defined by the second pre-determined frequency. The decomposer can further include a second envelope processor for generating the second high frequency program trace component signal, the second high frequency program trace component signal including an envelope of the second intermediate program trace component signal.

In another aspect, there is a method for non-intrusive program tracing a device. The method can involve generating a program trace signal from at least one of power consumption and electromagnetic emission of the device; decomposing the program trace signal into at least two program trace component signals; digitizing the program trace signal; collecting fragments of at least two digital program trace component signals of the program trace signal; and classifying fragment of at least two digital program trace component signals of the program trace signal as at least one of a known portion of program code and an observed behavior of the device, the at least two digital program trace component including the program trace signal decomposed and digitized.

Further aspects and advantages of the embodiments described herein will appear from the following description taken together with the accompanying drawings.

BRIEF DESCRIPTION OF THE DRAWINGS

For a better understanding of the embodiments described herein and to show more clearly how they may be carried into effect, reference will now be made, by way of example only, to the accompanying drawings which show at least one exemplary embodiment, and in which.

Figure 1:
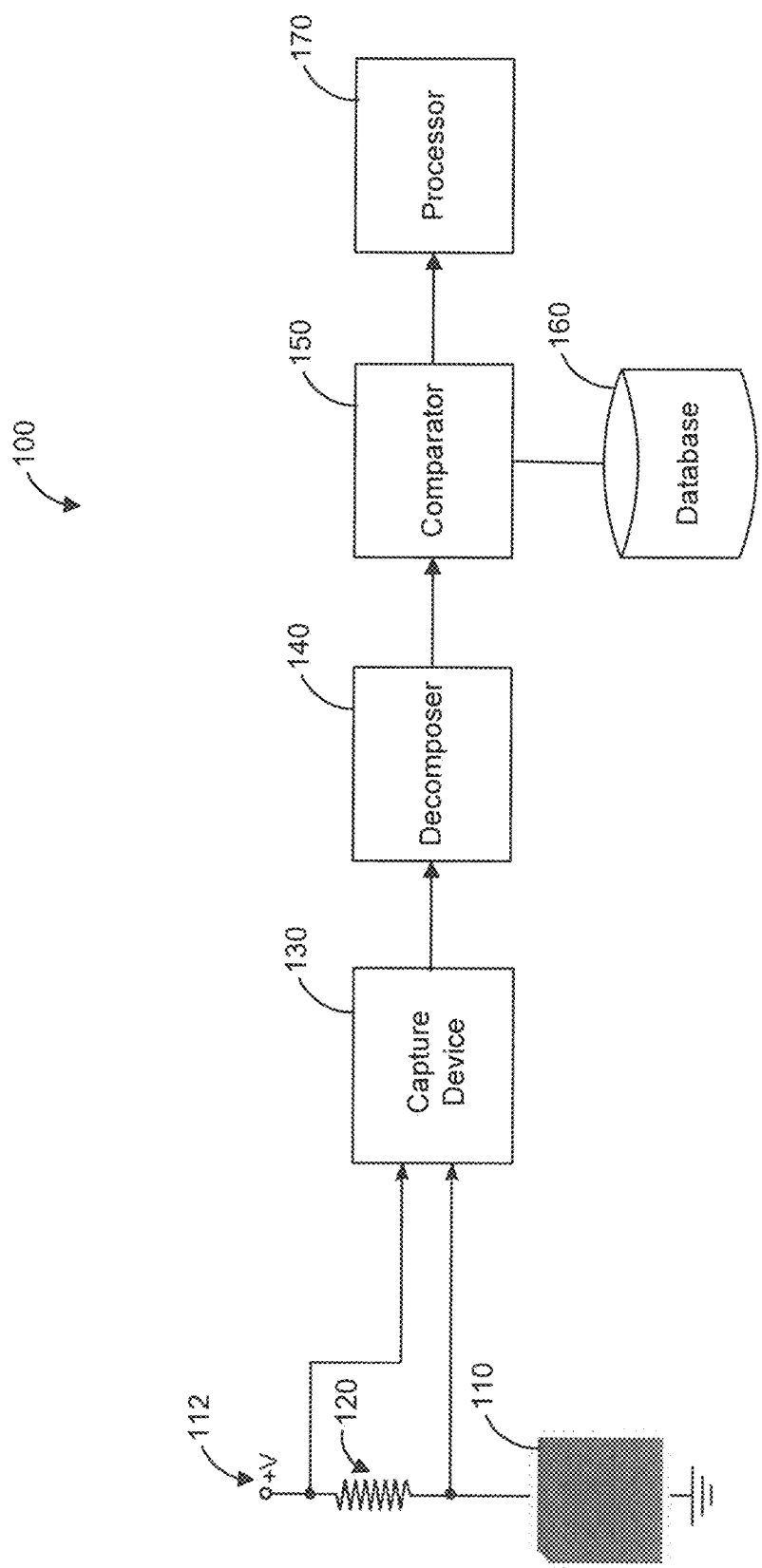
FIG. 1 is a diagram of a system for non-intrusive program tracing, using power tracing, for an embedded computing system, in accordance with at least one embodiment.

The skilled person in the art will understand that the drawings, described below, are for illustration purposes only. The drawings are not intended to limit the scope of the applicants' teachings in anyway. Also, it will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DESCRIPTION OF VARIOUS EMBODIMENTS

It will be appreciated that numerous specific details are set forth in order to provide a thorough understanding of the exemplary embodiments described herein. However, it will be understood by those of ordinary skill in the art that the embodiments described herein may be practiced without these specific details. In other instances, well-known methods, procedures and components have not been described in detail so as not to obscure the embodiments described herein. Furthermore, this description is not to be considered as limiting the scope of the embodiments described herein in any way, but rather as merely describing the implementation of the various embodiments described herein.

The terms "an embodiment," "embodiment," "embodiments," "the embodiment," "the embodiments," "one or more embodiments," "some embodiments," and "one embodiment" mean "one or more (but not all) embodiments of the present invention(s)," unless expressly specified otherwise.

The terms "including," "comprising" and variations thereof mean "including but not limited to," unless expressly specified otherwise. A listing of items does not imply that any or all of the items are mutually exclusive, unless expressly specified otherwise. The terms "a," "an" and "the" mean "one or more," unless expressly specified otherwise.

It should be noted that terms of degree such as "substantially", "about" and "approximately" when used herein mean a reasonable amount of deviation of the modified term such that the end result is not significantly changed. These terms of degree should be construed as including a deviation of the modified term if this deviation would not negate the meaning of the term it modifies.

In addition, as used herein, the wording "and/or" is intended to represent an inclusive-or. That is, "X and/or Y" is intended to mean X or Y or both, for example. As a further example, "X, Y, and/or Z" is intended to mean X or Y or Z or any combination thereof.

It should be noted that the term "coupled" used herein indicates that two elements can be directly coupled to one another or coupled to one another through one or more intermediate elements.

A description of an embodiment with several components in communication with each other does not imply that all such components are required. On the contrary a variety of optional components are described to illustrate the wide variety of possible embodiments of the present invention.

Further, although process steps, method steps, algorithms or the like may be described (in the disclosure and/or in the claims) in a sequential order, such processes, methods and algorithms may be configured to work in alternate orders. In other words, any sequence or order of steps that may be described does not necessarily indicate a requirement that the steps be performed in that order. The steps of processes described herein may be performed in any order that is practical. Further, some steps may be performed simultaneously.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article.

Non-intrusive program tracing can be achieved by monitoring side-effects, such as power consumption or EM emissions, of an embedded computing system as it executes a program. Power consumption or EM emission measurements as a function of time can be referred to as power traces or EM emissions traces, or more generally, program traces. The program traces can be correlated to program code executed by the embedded computing system or observed behavior of the embedded computing system during the program trace, in order to determine the sequence of executed instructions that the embedded computing system executed.

Referring to FIG. 1, shown therein is a diagram of a system 100 for non-intrusive program tracing for an embedded computing system, according to at least one embodiment. The system 100 can perform program tracing, and more specifically, power tracing of the embedded computing system 110. The system 100 includes a resistor 120, a capture device 130, a decomposer 140, a comparator 150, a database 160, and a processor 170.

In at least one embodiment, the embedded computing system 110 can be a microprocessor, memory chips, or interface circuits. The embedded computing system 110 receives power from power input line 112.

In at least one embodiment, a resistor 120 can be placed in series with the power input line of the embedded computing system 110. As shown in FIG. 1, the resistor 120 can be located outside of the computing system 110. In at least one embodiment, resistor 120 can be placed inside the embedded computing system 110. An analog signal indicative of the power consumption of the embedded computing system 110, or the power trace, can be obtained by measuring current or voltage across the resistor 120. In this manner, the resistor can act as a detector of the power consumption.

The capture device 130 can measure current across the resistor 120 in order to obtain the power trace. In addition, the capture device 130 can digitize the power trace. In at least one embodiment, the capture device 130 can be a contactless current sensor. In at least one embodiment, the capture device 130 can include an analog-to-digital converter. In at least one embodiment, the capture device 130 can be a sound card. In at least one embodiment, the capture device 130 can be an oscilloscope. In at least one embodiment, the capture device 130 can be a digital oscilloscope.

The decomposer 140 can split the program trace into a plurality of program trace components having different frequency bands, the bandwidth of each program trace component being smaller than the bandwidth of the program trace itself. The decomposer 140 can include one or more low-pass filters and one or more high-pass filters to split the program trace into two or more frequency bands. The two or more frequency bands can include a low frequency band and one or more high frequency bands. That is, the decomposer 140 can split the program trace into a low frequency program trace component signal and one or more high frequency program trace component signals.

The decomposer 140 also processes program trace components with higher frequencies to provide an envelope of the high frequency program trace components. The decomposer 140 can include one or more rectifiers to convert a program trace component to an absolute value of that program trace component. The decomposer 140 can include one or more envelope processors to provide an envelope of that program trace component, that is. The decomposer 140 can include any appropriate components for envelope processing, including, for example, an envelope detector, an RMS detector or a low-pass filter. When the decomposer 140 includes a low-pass filter for envelope processing, it can have any appropriate cutoff frequency. In some embodiments, the low-pass filter for envelope processing has a cutoff frequency that is less than the lowest frequency of the high frequency program trace component. That is, the low-pass filter for envelope processing can have a cutoff frequency that is less than the cutoff frequency of the high-pass filter generating the high frequency program trace component.

Decomposer 140 can receive the program trace from the capture device 130. In some embodiments, decomposer 140 receives a digital program trace from the capture device 130. When decomposer 140 receives a digital program trace from the capture device 130, the decomposer 140 requires a sufficiently high sampling rate and computing power to implement the decomposition of the digital program trace into a plurality of program trace components.

In other embodiments, decomposer 200 receives an analog program trace from the capture device 130. If decomposer 140 receives an analog program trace from the capture device 130, the system 100 can also include a converter (see e.g., converter 132 shown in FIGS. 4 and 8) to digitize the program trace components from the decomposer to provide digital program trace components.

Since the program trace is split into a plurality of program trace components having different frequency bands, candidate samples are also split into a plurality of candidate sample components having the same bands as the program trace components. In some embodiments, decomposer 140 can also receive candidate samples from the database 160 and split the candidate samples into the plurality of candidate sample components. In some embodiments, the decomposer 140 can generate the candidate sample components in advance and store the candidate sample components in the database 160 (not shown in FIG. 1). In some embodiments, an additional decomposer (not shown in FIG. 1) can generate the candidate sample components at run-time.

The comparator 150 can receive the digital power trace components from the decomposer 140. In some embodiments, the comparator 150 can continuously receive and process the digital power trace components from the decomposer 140. That is, the comparator 150 can receive and process each sample of the digital power trace components. In some embodiments, the comparator 150 can process a downsampled version of the digital power trace component signals. That is, the comparator 150 can receive each sample of the digital power trace component signals and then process every "N" samples. The downsampling ratio, "N", can be a value small enough to ensure high granularity and thus "continuous" processing.

The comparator 150 can include a first-in-first-out (FIFO) buffer. The FIFO buffer can store fragments of current and past samples of the digital program trace components for comparison with candidate sample components. In at least one embodiment, the candidate sample components can be stored in database 160 and the comparator 150 retrieves the candidate sample component from the database 150. In at least one embodiment, the comparator 150 can receive the candidate sample components from a decomposer, such as decomposer 140.

The length of the FIFO buffer can relate to the length of the longest candidate sample stored in the database 160. In some embodiments, the length of the longest candidate sample can correspond to the portion of program code exhibiting the longest execution time. A fragment of the digital program trace can be compared with each candidate sample in the database 160 in order to determine the portion of program code that the digital program trace corresponds to. The comparison can generate a distance or a measure of the fragment of the digital program trace with a candidate sample from the database 160.

In some embodiments, the FIFO buffer can have a varying length. For example, in a first instance, the FIFO buffer can have a first length and in a second instance, the FIFO buffer can have a second length that is different from the first length.

As shown in FIG. 1, in some embodiments, the system can include a database 160 storing candidate samples in association with, or linked with, known portions of program code and/or observed behavior. The database 160 can be created during a training stage in which program traces are obtained for known portions of program code and/or observed behavior. That is, a portion of program code can be executed in order to generate and obtain a candidate sample. Furthermore, a portion of program code can be executed multiple times to obtain multiple candidate samples for the known portion of program code and/or observed behavior. In some embodiments, the database 160 can also be updated with additional candidate samples after the training stage. In some embodiments, the database 160 can be created without a training stage. That is, the database 160 can be propagated by adding additional candidate samples during the operation of the system.

In some embodiments, candidate samples can vary in length. In such cases, multiple candidate samples for a given portion of program code and/or observed behavior can be stored. Each candidate sample can be labelled with the corresponding portion of program code and/or observed behavior and stored in the database 160.

In some embodiments, portions of program code can be selected such that all candidate samples corresponding to a given portion of program code have a fixed length. That is, each of the candidate samples can have equal lengths. In such cases, a mean, or an average of multiple candidate samples for a given portion of program code can be stored. The mean candidate sample can then be labeled with the corresponding portion of program code and stored in the database 160.

Similarly, in some embodiments, the fragments extracted directly from the power trace based on observed behaviors or patterns can be selected such that all candidate samples for a given behavior or pattern have a fixed length.

In some embodiments, the database 160 stores each candidate sample as a plurality of candidate sample components having different frequency bands, the bandwidth of each candidate sample component being smaller than the bandwidth of the candidate sample itself. The candidate sample components can be generated by a decomposer, such as decomposer 140 and stored in the database 160 for subsequent retrieval. Storage of the candidate sample components can be advantageous for reducing run-time processing.

The processor 170 can include memory to store computer programs that are executable by the processor 170 (e.g. using the memory). In some embodiments, processor 170 can execute computer programs that implement a classifier. The processor 170 can receive the distances of a fragment of the digital program trace component to each candidate sample component having the same bandwidth. In turn, the processor 170 can determine which candidate sample the fragment corresponds to.

While FIG. 1 shows system 100 including a comparator 150 and a database 160, in some embodiments, a system for non-intrusive program tracing of a device does not include a comparator, such as comparator 150, and/or a database, such as database 160. For example, in some embodiments, the processor 170 can be in communication with the database 160, receive the digital power trace components from the decomposer 140, and compare the digital power trace components with the candidate samples in the database 160. Furthermore, as described in reference to FIG. 6, in some embodiments, the system does not include a database, such as database 160.

Figure 2:
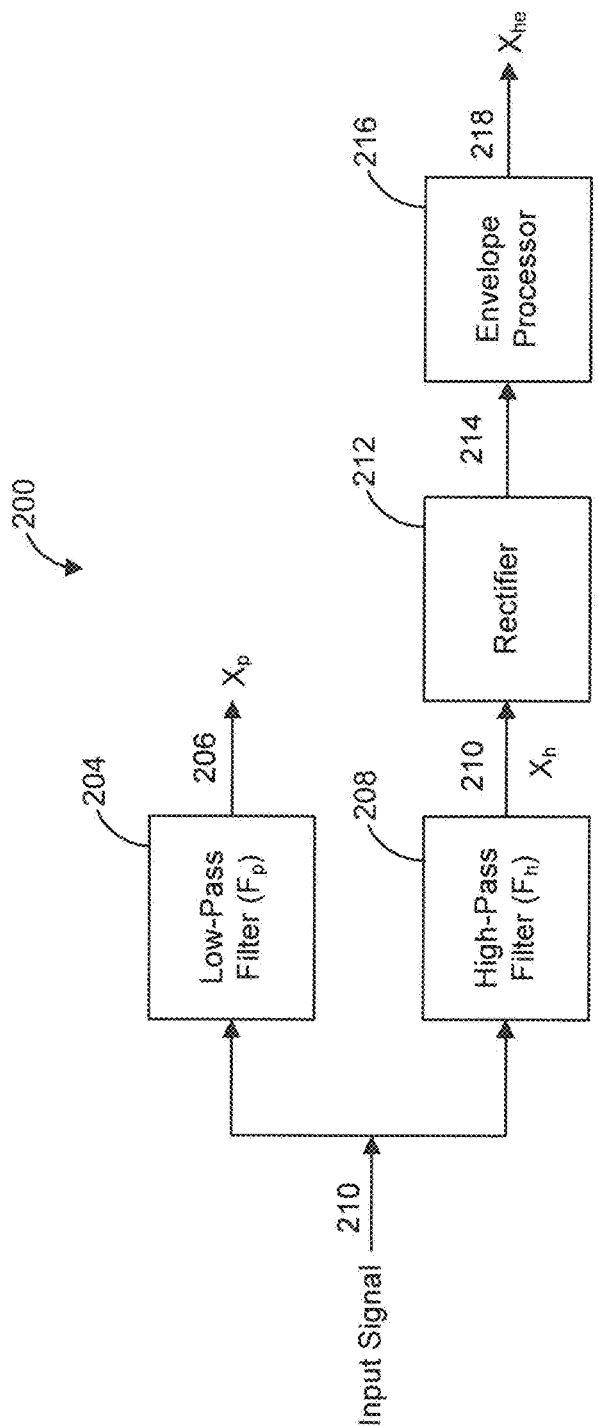
FIG. 2 is a diagram of a decomposer for splitting a single power trace into two power trace components, in accordance with at least one embodiment.

Referring now to FIG. 2, shown therein is an example decomposer 200 for a single power trace in accordance with at least one embodiment. Decomposer 200 splits the input signal, that is, the program trace into two program trace components having different frequency bands, the bandwidth of each program trace component being smaller than the bandwidth of the program trace itself. While only processing of a single power trace is shown in FIG. 2, it is understood that each power trace can be similarly processed.

Decomposer 200 includes a low-pass filter 202 and a high-pass filter 208. Each of the low-pass filter 202 and the high-pass filter 208 receive the decomposer input signal 202. The low-pass filter 202 then provides a low frequency program trace component signal ($X_p$) 206 comprising the portion of the input signal 202 having frequencies below the cutoff frequency of the low-pass filter ($F_p$). The high-pass filter 208 provides a first intermediate program trace component signal ($X_h$) 210 comprising the portion of the input signal 202 having frequencies above the cutoff frequency of the high-pass filter ($F_h$).

The cutoff frequencies ($F_p$ and $F_h$) of the low-pass and high-pass filters are pre-determined, namely, at the design stage of the system 100. The cutoff frequencies ($F_p$ and $F_h$) of the low-pass and high-pass filters can be any appropriate values. In at least one embodiment, the cutoff frequency of the low-pass filter ($F_p$) is equal to the cutoff frequency of the high-pass filter ($F_h$). In at least one embodiment, the cutoff frequency of the low-pass filter ($F_p$) is greater than the cutoff frequency of the high-pass filter ($F_h$).

In at least one embodiment, the cutoff frequency of the low-pass filter ($F_p$) can even be less than the cutoff frequency of the high-pass filter ($F_h$). Theoretically, having a low-pass filter ($F_p$) with a cutoff frequency being less than the cutoff frequency of the high-pass filter ($F_h$) is less desirable because some frequency bands of the program trace will not be analyzed. However, in practice, such an embodiment may be useful because filters are not ideal components and some bands may leak into the filter's output.

Decomposer 200 also includes a rectifier 212 and an envelope processor 216 to further process program trace components having higher frequencies, namely, the first intermediate program trace component signal ($X_h$) 210. Rectifier 212 receives the first intermediate program trace component signal ($X_h$) 210 from the high-pass filter 208 and outputs a second intermediate program trace component signal 214 comprising the absolute value of the first intermediate program trace component signal ($X_h$) 210.

Envelope processor 216 receives the second intermediate program trace component signal 214 from the rectifier 212 and outputs a high frequency program trace component signal ($X_{he}$) 218 comprising an envelope of the absolute value of the first intermediate program trace component signal ($X_h$) 210. If the envelope processor 216 includes a low-pass filter (not shown), it can have any appropriate cutoff frequency. In some embodiments, it can have a cutoff frequency less than the cutoff frequency of the high pass filter ($F_h$). In some embodiments, it can have a cutoff frequency equal to the cutoff frequency of the high pass filter ($F_h$). In some embodiments, it can have a cutoff frequency greater than the cutoff frequency of the high pass filter ($F_h$).

In some embodiments, the bandwidth of two or more of the program trace component signals are approximately equal. In some embodiments, the bandwidth of each of the program trace components signals are unequal.

Figure 3:
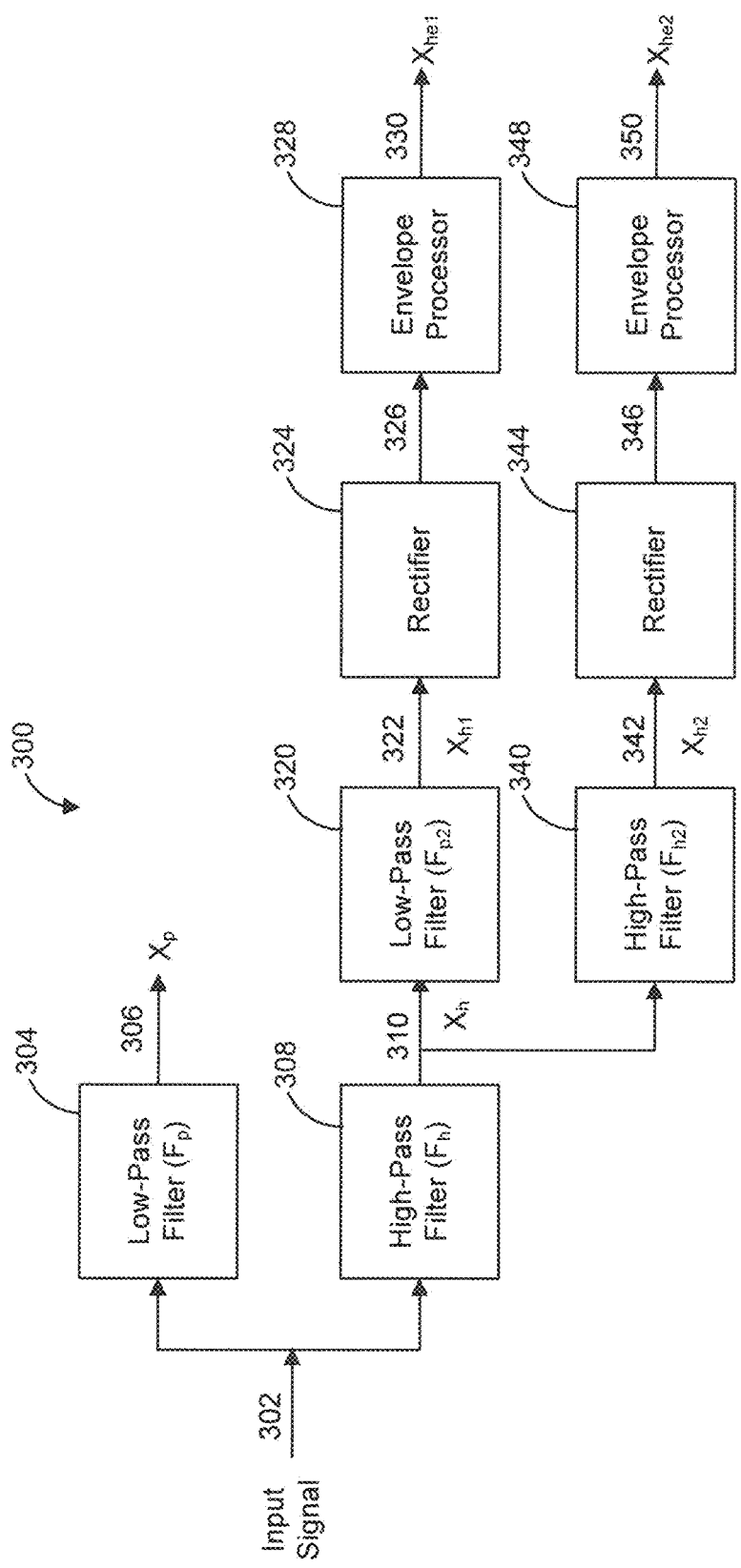
FIG. 3 is a diagram of a decomposer for splitting a single power trace into three power trace components, in accordance with at least one embodiment.

Referring now to FIG. 3, shown therein is an example decomposer 300 for a single power trace in accordance with at least one embodiment. Similar to FIG. 2, FIG. 3 only illustrates processing of a single power trace. However, each power trace can be similarly processed. Decomposer 300 splits the input signal, that is, the program trace into three program trace components having different frequency bands, the bandwidth of each program trace component being smaller than the bandwidth of the program trace itself.

Similar to decomposer 200, decomposer 300 includes a low-pass filter 302 and a high-pass filter 308. Each of the low-pass filter 302 and the high-pass filter 308 receive the decomposer input signal 302. The low-pass filter 304 then provides a low frequency program trace component signal ($X_P$) 306 comprising the portion of the input signal 302 having frequencies below (i.e., less than) the cutoff frequency of the low-pass filter ($F_p$). The high-pass filter 308 provides a first intermediate program trace component signal ($X_h$) 310 comprising the portion of the input signal 302 having frequencies above (i.e., greater than) the cutoff frequency of the high-pass filter ($F_h$).

Decomposer 300 also includes an additional low-pass filter 320 having a cutoff frequency ($F_{p2}$) and high-pass filter 340 having a cutoff frequency ($F_{h2}$). Typically, the cutoff frequency of the low-pass filter ($F_{p2}$) 320 and the cutoff frequency of the high-pass filter ($F_{h2}$) 340 are greater than the cutoff frequency of the high-pass filter ($F_h$) 308. Furthermore, the cutoff frequency of the low-pass filter ($F_{p2}$) 320 is generally equal to the cutoff frequency of the high-pass filter ($F_{h2}$) 340.

As shown in FIG. 3, low-pass filter 320 and high-pass filter 340 are cascaded with high-pass filter 308. That is, low-pass filter 320 and high-pass filter 340 receive, as inputs, the output of high-pass filter 308. In at least one embodiment, low-pass filter 320 and high-pass filter 340 can be cascaded with low-pass filter 304. However, cascading may result in distortions and increased noise. In at least one embodiment, low-pass filter 320 and high-pass filter 340 can be parallel to low-pass filter 304 and high-pass filter 308. That is, low-pass filter 320 and high-pass filter 340 can receive the same input as high-pass filter 308, namely, input signal 302.

In decomposer 300, each of the low-pass filter 320 and the high-pass filter 340 receive the first intermediate program trace component signal ($X_{h1}$) 310. Low-pass filter 320 then provides a second intermediate program trace component signal 322 comprising the portion of the first intermediate program trace component signal ($X_{h1}$) 310 having frequencies below the cutoff frequency of the low-pass filter ($F_{p2}$) 320. As a result, the second intermediate program trace component signal 322 comprises the portion of the input signal 302 having frequencies above $F_{p2}$ and below $F_h$. The high-pass filter 340 provides a third intermediate program trace component signal ($X_{h2}$) 342 comprising the portion of the first intermediate program trace component signal ($X_{h1}$) 310 having frequencies above the cutoff frequency of the high-pass filter ($F_{h2}$) 340. The third intermediate program trace component signal 342 comprises the portion of the input signal 302 having frequencies above $F_{h2}$.

Similar to decomposer 200, decomposer 300 also includes rectifiers 324, 344 and envelope processors 328, 348 to further process program trace components having higher frequencies, namely, the second intermediate program trace component signal ($X_{h1}$) 322 and the third intermediate program trace component signal ($X_{h2}$) 342.

Rectifier 324 receives the second intermediate program trace component signal ($X_{h1}$) 322 from the low-pass filter 320 and outputs a fourth intermediate program trace component signal 326 comprising the absolute value of the second intermediate program trace component signal ($X_{h1}$) 322. Envelope processor 328 receives the fourth intermediate program trace component signal 326 from the rectifier 324 and outputs the second program trace component signal ($X_{he1}$) 330, or the first high frequency program trace component signal, comprising an envelope of the absolute value of the second intermediate program trace component signal ($X_{h1}$) 322

Rectifier 344 receives the third intermediate program trace component signal ($X_{h2}$) 342 from the high-pass filter 340 and outputs a fifth intermediate program trace component signal 346 comprising the absolute value of the third intermediate program trace component signal ($X_{h2}$) 342. Envelope processor 348 receives the fifth intermediate program trace component signal 346 from the rectifier 344 and outputs the third program trace component signal ($X_{he2}$) 350, or the second high frequency program trace component signal, comprising an envelope of the absolute value of the third intermediate program trace component signal ($X_{h1}$) 342. If the envelope processor 328 is a low-pass filter (not shown), it can have cutoff frequency of $F_{h2}$.

In some embodiments, rectifiers 324, 344 and envelope processors 328, 348 can be identical. For example, if envelope processors 328, 348 each include low-pass filters, their cutoff frequencies can be identical.

In some embodiments, the bandwidth of two or more of the program trace component signals ($X_p$, $X_{he1}$, $X_{he2}$) are approximately equal. In some embodiments, the bandwidth of each of the program trace components signals are unequal.

Figure 4:
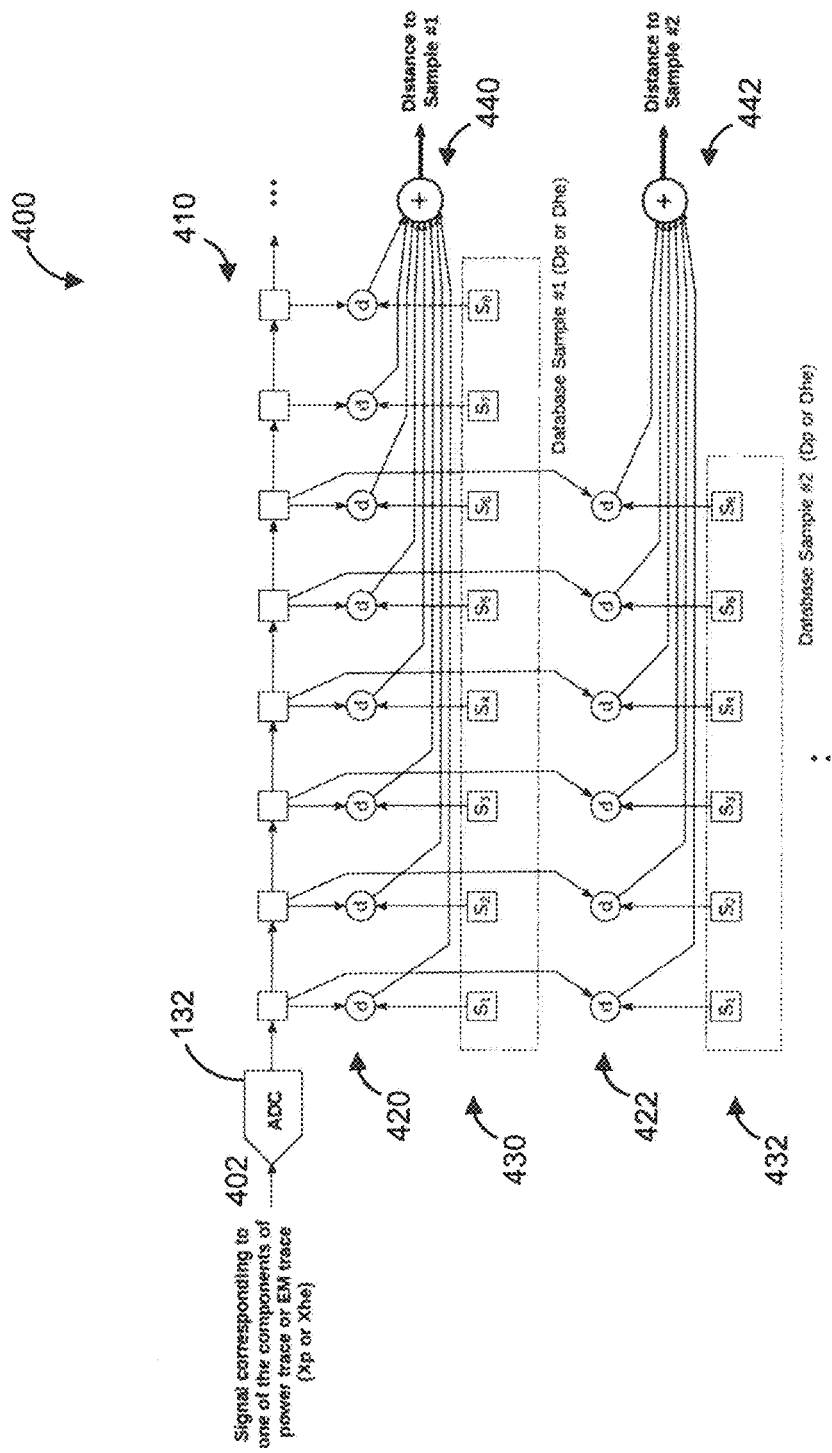
FIG. 4 is a diagram of an architecture for a comparator, in accordance with at least one embodiment.

Referring to FIG. 4, shown therein is a diagram of an architecture for a comparator 400 in accordance with at least one embodiment. The comparator 400 can evaluate distances 420 and 422 between a fragment 410 of the digital program trace and candidate samples 430 and 432. The candidate samples 430 and 432 can be stored in the database 160 (shown as "database sample"). Furthermore, the comparator 400 can evaluate a distance 420 between a fragment 410 of the digital program trace and each of candidate samples 430 and 432, simultaneously.

While FIG. 4 only shows two candidate samples 430 and 432, it is understood that any number of candidate samples 430 and 432 can be compared simultaneously. That is, each of candidate samples 430 and 432 can be compared with a fragment 410 simultaneously (i.e., "in parallel"). In some embodiments, the comparison of each of candidate samples 430 and 432 with fragment 410 can be performed in sequence (i.e., "pipelined" or "in series").

As shown in FIG. 4, each of candidate samples 430 and 432 is an ordered set of values. Candidate samples 430 and 432 can have different lengths: candidate sample 430 includes eight values while candidate sample 432 can includes six values.

Operators 420 and 422 are generally distance operators that compute a difference between two values. Operators 420 and 422 can implement various operations based on the difference. For example, operators 420 and 422 can implement the square of the difference between the two values, or the absolute value of the difference between the two values. Operators 420 and 422 are generally the same operation. That is, if operator 420 determines the absolute value of the difference between two values, operator 422 also determines the absolute value of the difference between two values.

In FIG. 4, operators 440 and 442 can implement a weighted sum. A weighted sum can be the sum of all of its inputs scaled by a certain factor, or the average of all of its inputs, or in general, any combination of the inputs.

FIG. 4 only shows the processing of a single band of the power trace, that is, the determination of the distance between a single program trace component 402 and a database sample component having the same band—as the program trace component 402. It is understood that each band of the power trace can be similarly processed.

After the distance between the program trace component 402 and the candidate sample component for each bandwidth (herein referred to as the distance components of each bandwidth) is determined, the distance for a program trace is determined based on the distance components of each bandwidth. Comparator 400 includes an additional summation operator (not shown in FIG. 4) for determining the distance of a program trace with a candidate sample based on the distance components of each bandwidth.

The additional summation operator for determining the distance of a program trace with a candidate sample can be any appropriate summation operation. For example, in at least one embodiment, the additional summation operator can be a simple summation of the distances for each band. In at least one embodiment, the additional summation operator can be the square of the distances for each band.

For example, when the program trace is split into the two program trace component signals ($X_p$ and $X_{he}$) by decomposer 200, the candidate sample is similarly split into two candidate sample component signals ($D_p$ and $D_{he}$). A low frequency component distance ($d_p$) between the low frequency program trace component signal ($X_p$) and the low frequency candidate sample component signal ($D_p$) is determined as well as a high frequency component distance ($d_{he}$) between the high frequency program trace component signal ($X_{he}$) and the high frequency candidate sample component signal ($D_{he}$). The distance between the program trace and the candidate sample is computed by, for example, adding the low frequency component distance ($d_p$) and the high frequency component distance ($d_{he}$).

In another example, when the program trace is split into the three program trace component signals ($X_p$, $X_{he1}$, and $X_{he2}$) by decomposer 300, the candidate sample is similarly split into three candidate sample component signals ($D_p$, $D_{he1}$, and $D_{he2}$). A low frequency component distance ($d_p$) between the low frequency program trace component signal ($X_p$) and the low frequency candidate sample component signal ($D_p$) is determined. In addition, a first high frequency component distance ($d_{he1}$) between the first high frequency program trace component signal ($X_{he1}$) and the first high frequency candidate sample component signal ($D_{he}$) and a second high frequency component distance ($d_{he2}$) between the second high frequency program trace component signal ($X_{he2}$) and the second high frequency candidate sample component signal ($D_{he2}$) are determined. The distance between the program trace and the candidate sample is computed by, for example, the square root of the sum of the square of the distances for each bandwidth, namely, the square root of the sum of the square of the low frequency component distance ($d_p$), the first high frequency component distance ($d_{he1}$), and the second high frequency component distance ($d_{he2}$).

The calculation of the distance between fragments and the candidate samples can be computationally intensive and can depend on the bandwidth of the fragments. By decomposing the program trace into program trace components having smaller bandwidths, the computational requirements for calculating the distance between fragments of the program trace components and candidate sample components is reduced. Furthermore, it can be advantageous to decompose the program trace into program trace components having approximately equally bandwidths (but different frequency bands). In this manner, the computational requirements can be reduced by the number of program trace components.

In some embodiments, the comparator 150 can be implemented in hardware, software, or a combination of hardware and software. When the comparator 150 is a hardware-based comparator, it can be implemented on a field-programmable gate array (FPGA). In some embodiments, the hardware architecture can be implemented on an application-specific integrated circuit (ASIC). In some embodiments, the hardware architecture can be implemented based on digital signal processors. In some embodiments, the hardware architecture can be implemented based an array of microcontrollers and/or external memory. In some embodiments, the hardware architecture can be implemented based on discrete digital components.

When the comparator 150 is a software-based comparator, it can be implemented on a computer processor, such as a general purpose microprocessor or microcontroller, and coupled to memory storing computer-executable instructions.

Figure 5:
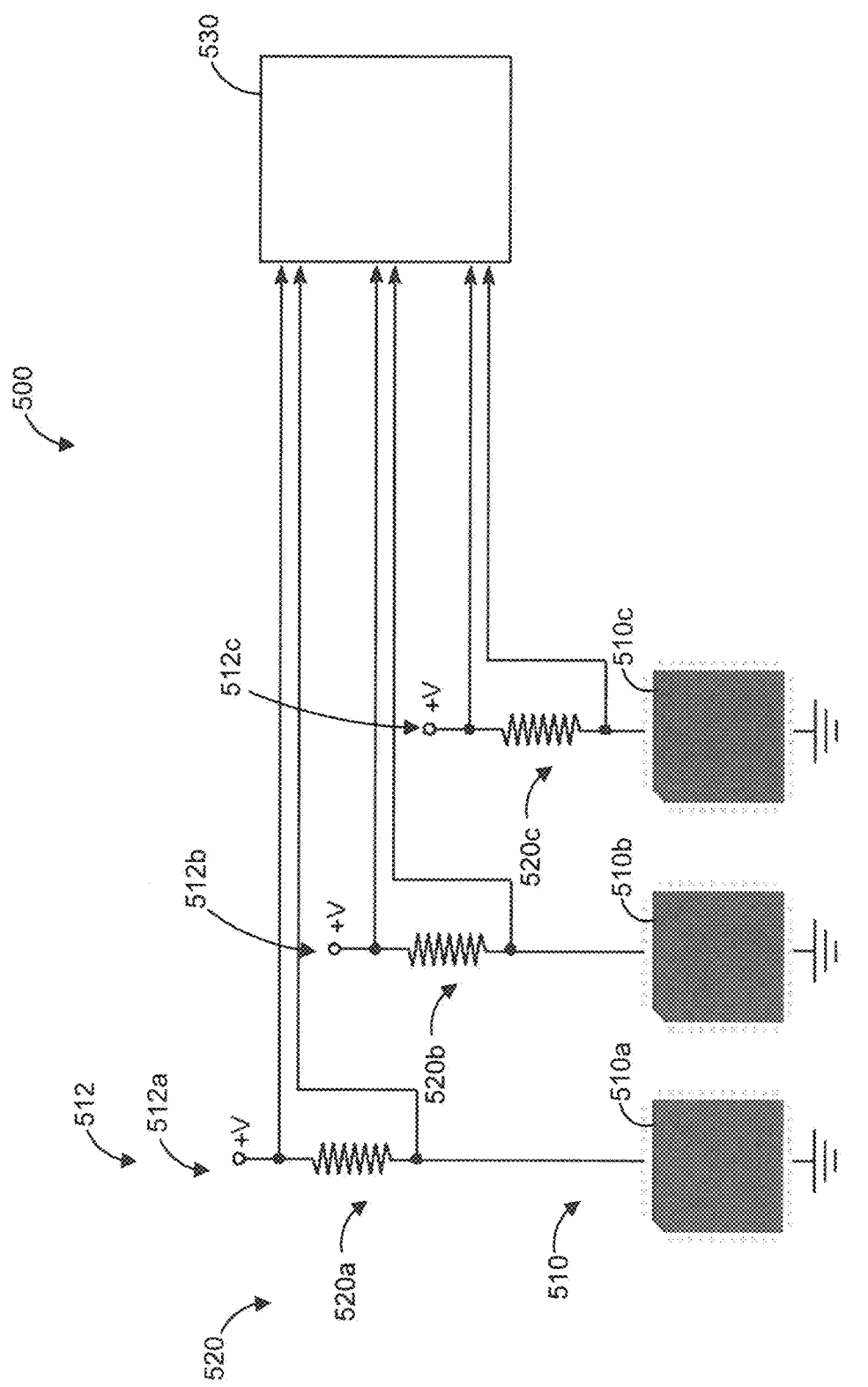
FIG. 5 is a diagram of another system for non-intrusive program tracing, using power tracing, for an embedded computing system, in accordance with at least one embodiment.

Referring to FIG. 5, shown therein is a diagram of another system 500 for non-intrusive program tracing for an embedded computing system 510, according to at least one embodiment. The system 500 can perform multiple power traces. The system 500 includes resistors 520 (as shown in FIG. 5, the resistors 520a, 520b, and 520c may be collectively referred to as the resistors 520), a multi-capture device 530. While not shown in FIG. 5, the system 500 also includes a decomposer 140, a comparator 150, and a processor 170, similar to that of system 100.

As shown in FIG. 5, a resistor 520 is placed in series with each of the power input lines 512 (as shown in FIG. 5, the power lines 512a, 512b, and 512c may be collectively referred to as the power lines 512).

In some embodiments, the multiple power lines 512 relate to a single embedded computing system 510. For example, the single embedded computing device 510 can be a multi-core processor that operates with different voltages and/or different power requirements requiring separate power-In lines. In another example, a standard PC can include a motherboard having a power connection with multiple power lines.

In some embodiments, the multiple power lines 512 relate to multiple embedded computing systems 510 (as shown in FIG. 5, the embedded computing systems 510a, 510b, and 510c may be collectively referred to as the power lines 510). For example, the system 500 can monitor the power consumed by a microprocessor, the power consumed by external memory chips, and/or the power consumed by external interface circuits, etc.

Monitoring multiple power lines can increase the accuracy of the classifier as it provides additional sample points for a portion of program code. In some embodiments, multiple power lines can be treated as a vector (e.g., multi-dimensional signal). A fragment from each power line can be compared with a respective candidate sample in parallel.

Figure 6:
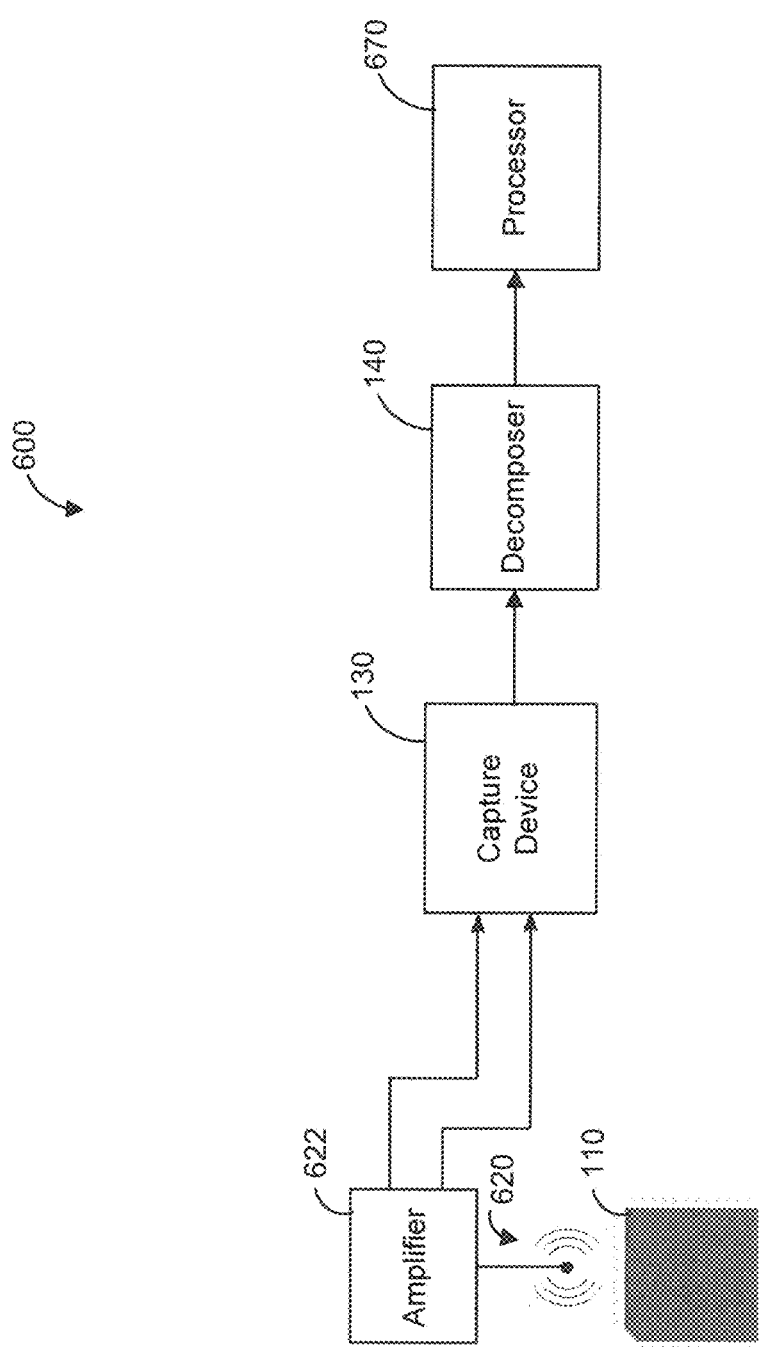
FIG. 6 is a diagram of a system for non-intrusive program tracing, using electromagnetic emissions tracing, for an embedded computing system, in accordance with at least one embodiment.

Referring to FIG. 6, shown therein is a diagram of a system 600 for non-intrusive program tracing for an embedded computing system, according to at least one embodiment. The system 600 can perform electromagnetic (EM) emissions tracing of the embedded computing system 110. The system 600 includes an antenna 620, an amplifier 622, a capture device 130, a decomposer 140, and a processor 670.

In at least one embodiment, an antenna 620 can be placed in the vicinity of the embedded computing system 110 to detect electromagnetic emissions of the embedded computing system 110. In some embodiments, additional signal conditioning is required in order to provide a signal within the operating range of the capture device 130. In some embodiments, the antenna 620 can be cascaded with an amplifier 622 to increase the strength of the signal from the antenna 620. In such cases, it is understood that the antenna 620 acts as a detector of the electromagnetic emissions.

As shown in FIG. 6, the system 600 does not include a database, such as database 160, or a comparator, such as comparator 150. Instead, the processor 670 can implement a model representing the program trace (e.g., power consumption or EM emissions) as a function of the corresponding executed portion of program code and/or observed behavior of the device. The model can include a machine learning model, such as a neural network, that can classify a given program trace with a portion of program code and/or observed behavior of the device. That is, the processor 670 can receive the digital power trace components of a program trace signal from the decomposer 140 and classify the program trace signal as a known portion of program code and/or observed behavior of the device.

As indicated by common reference numerals, the capture device 130 and the decomposer 140 of system 600 are similar to those of system 100. Also similar to power tracing, EM emissions tracing can be performed with a single probe to capture a single EM emissions trace, such as system 100, or with multiple probes to capture multiple EM emissions traces, such as system 500. Multiple EM emissions traces can relate to multiple independent components or different areas of a single component.

Figure 7:
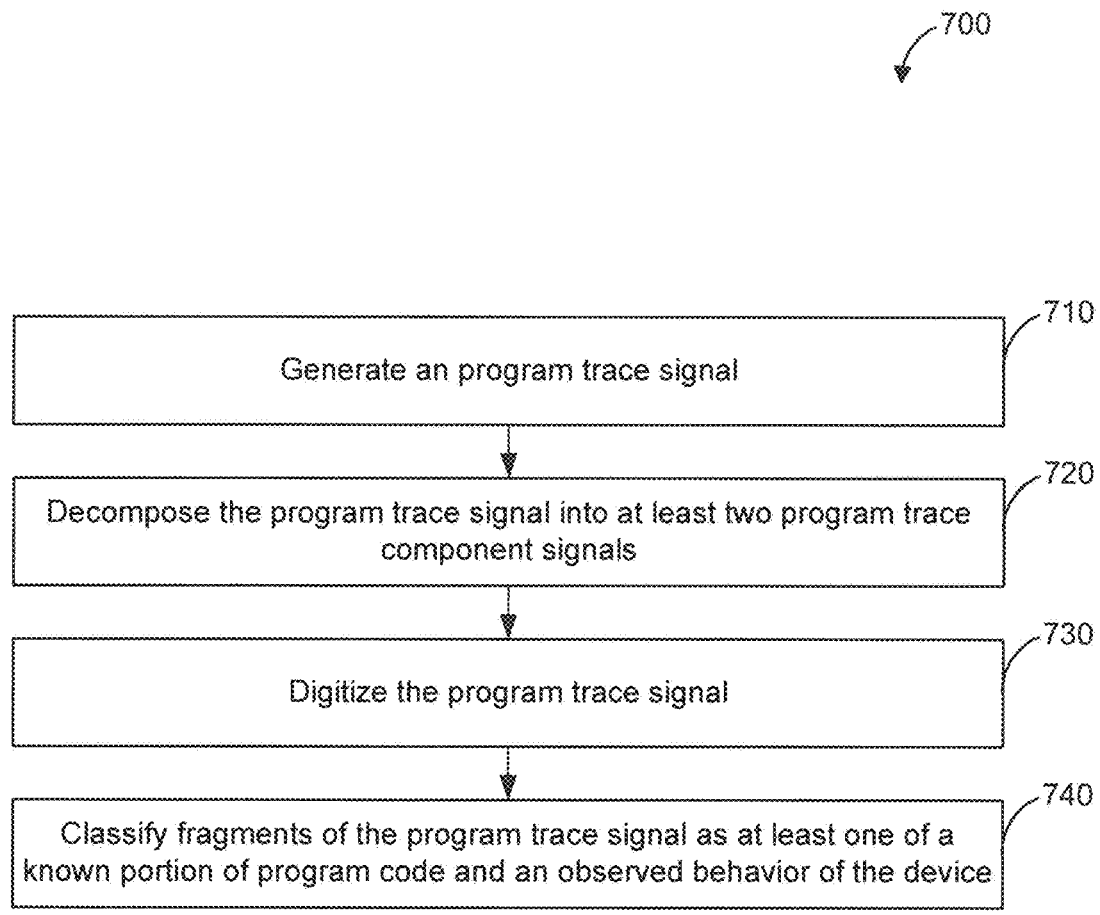
FIG. 7 is a flowchart of a method for non-intrusive program tracing for an embedded computing system, in accordance with to at least one embodiment.

Referring to FIG. 7, shown therein is a method 700 of non-intrusive program tracing for an embedded computing system.

Initially, at step 710, a program trace signal of the device is obtained. The program trace signal can be an analog signal having a bandwidth. In some embodiments, the program trace signal can be indicative of the power consumption of the device. A power trace of a device can be obtained by the current of a shunt resistor placed in series with a power line of the device. In some embodiments, the program trace signal can be indicative of electromagnetic emissions of the device. An antenna cascaded with an amplifier can detect the electromagnetic emissions of the device.

At step 720, the program trace signal of step 710 is decomposed to obtain at least two program trace component signals having different bandwidths. Each of the program trace component signals have a bandwidth that is less than the bandwidth of the program trace signal of step 710. In some embodiments, only two program trace component signals are obtained in step 720. In some embodiments, three or more program trace component signals are obtained in step 720. The program trace signal can be obtained by any appropriate device including, but not limited to, low-pass filters, high-pass filters, rectifiers, and envelope detectors.

At step 730, the program trace signal is digitized. In some embodiments, each of the program trace component signals obtained in step 720 are digitized. That is, the program trace signal is decomposed prior to being digitized. In other embodiments, the program trace signal obtained in step 710 is digitized. That is, the program trace signal is digitized prior to being decomposed. The digital program trace signal can be obtained by any appropriate device including, but not limited to, an analog-to-digital converter, a contactless current sensor, an oscilloscope, or a sound card.

At step 740, fragments of the program trace signal can be classified as one of a known portion of program code of the embedded computing device. In some embodiments step 740 involves using a machine intelligence model to classify the fragments of the program trace signal.

In some embodiments, the method also involves providing a database storing a plurality of candidate samples, collecting a fragment of each of the digital program trace component signals of the program trace signal, and determining a distance between the fragment and each of the candidate samples stored in the database. Each candidate sample can be associated with a particular known portion of program code of the embedded computing device.

A first-in-first-out (FIFO) buffer can be used to collect the fragment in order to have access to the current sample and past samples. The number of past samples held by the FIFO buffer is a design parameter of the buffer; that is, the length of the buffer. The length of the buffer can be determined for each target system being monitored. Generally, the length of the longest candidate sample stored in the database can be selected as the length of the buffer.

For each candidate sample, the distance between the fragment, that is the program trace at the current position, and the candidate sample is evaluated. This step can be performed using hardware so that all of the elements in the fragment are processed simultaneously and a distance to each candidate sample is output at each time index (a time index refers to one analog sample of the power trace, taken by the analog-to-digital converter, and it corresponds to a position in the power trace). This output is, thus, the distance to the candidate sample as a function of the position where the match is attempted.

In some embodiments, step 740 can involve a pre-determined criterion in order to determine whether a fragment can be classified as a candidate sample of the database. In some embodiments, a fragment can relate to unknown behavior or program code and the unknown behavior or program code may not correspond to any candidate samples in the database. When the fragment does not relate to known program code or prior observed behavior, the fragment code may not be classified. Instead, the fragment can be stored in the database as an additional candidate sample. After the fragment is stored in the database, the fragment, as an additional candidate sample, can be used for future classifications.

The pre-determined criterion can be any appropriate criterion. In some embodiments, the pre-determined criterion can be a distance threshold. In order to be classified, the distance between the fragment and a candidate sample must be less than the distance threshold.

Fragments of the program trace signal can be classified as one of the plurality of candidate samples stored in the database, based on the distance between the fragment 410 and each of the candidate samples. Any appropriate algorithm can be used determine a classification based on each of the distances received. Algorithms can include but is not limited to correlation analysis, mutual information analysis, statistical processing, including system identification, and pattern recognition techniques. In addition, prior to classification, additional processing can be performed to filter and enhance the captured data (e.g., reduce measurement noise) and to extract spectral information for the statistical processing phase. Such additional processing can be digital signal processing techniques.

In at least one embodiment, a classification can be made based on the smallest distance determined. That is, the fragment can be classified as the candidate sample having a distance with the fragment that is less than or equal to the distance of each of the other candidate samples.

In at least one embodiment, a classification can be made based on the sequence of the distances determined. That is, the classification can be made based on the temporal order of the distance determined for the fragment 410 and past fragments.

In at least one embodiment, the classification can use a pair of distances between the program signal components instead of the combined distance of the program signal components.

In at least one embodiment, the classification can use auxiliary information. Auxiliary information can be used to identify a subset of candidate samples that the fragment 410 can be classified as. Any available auxiliary information can be used. In some embodiments, auxiliary information can reduce the classification processing time. In some embodiments, auxiliary information can increase the accuracy of the classification.

For example, in some embodiments, auxiliary information can include rules that identify subsets of candidate samples given the feasible sequences according to the source code of the program. That is, by inspecting the source code of the program, it may be known that after executing program code associated with candidate sample 1, the subsequent program code can only be program code associated with candidate sample 5 or candidate sample 7. This means that the classifier, after having identified candidate sample 1, can re-run the classifier with subset of the database that contains only candidate samples 5 and 7 because it is known that candidate samples 5 and 7 are the only possible candidates.

In some embodiments, the classification involves software executed by the processor 170 to process the outputs from the comparator 150. In some embodiments, the software can also drive multiplexers in a hardware-based comparator to compute the distance between the fragment 410 and different sets of candidate samples.

In some embodiments, the fragment 410 can be processed prior to determination of the distance between the fragment 410 and each of the candidate samples. Pre-processing of the fragment 410 prior to comparison can reduce noise that occurs between fragments 410. As a result, the comparison is less sensitive to the actual position at which the comparison is made.

In some embodiments, the classification can be facilitated by the addition of markers in the program code. Markers can be added in the program code so that they generate easily identifiable portions of the program trace. Markers can be special fragments of program code that have no significant effect on the outcome of the program but generate easily identifiable program traces.

In some embodiments, the classification can be facilitated by strategic arrangement of the program code. More specifically, the program code can be arranged in a manner that does not affect the outcome of the program but such that different portions of program code will produce program traces that are very different, such that they are easily distinguishable by the classifier.

Figure 8:
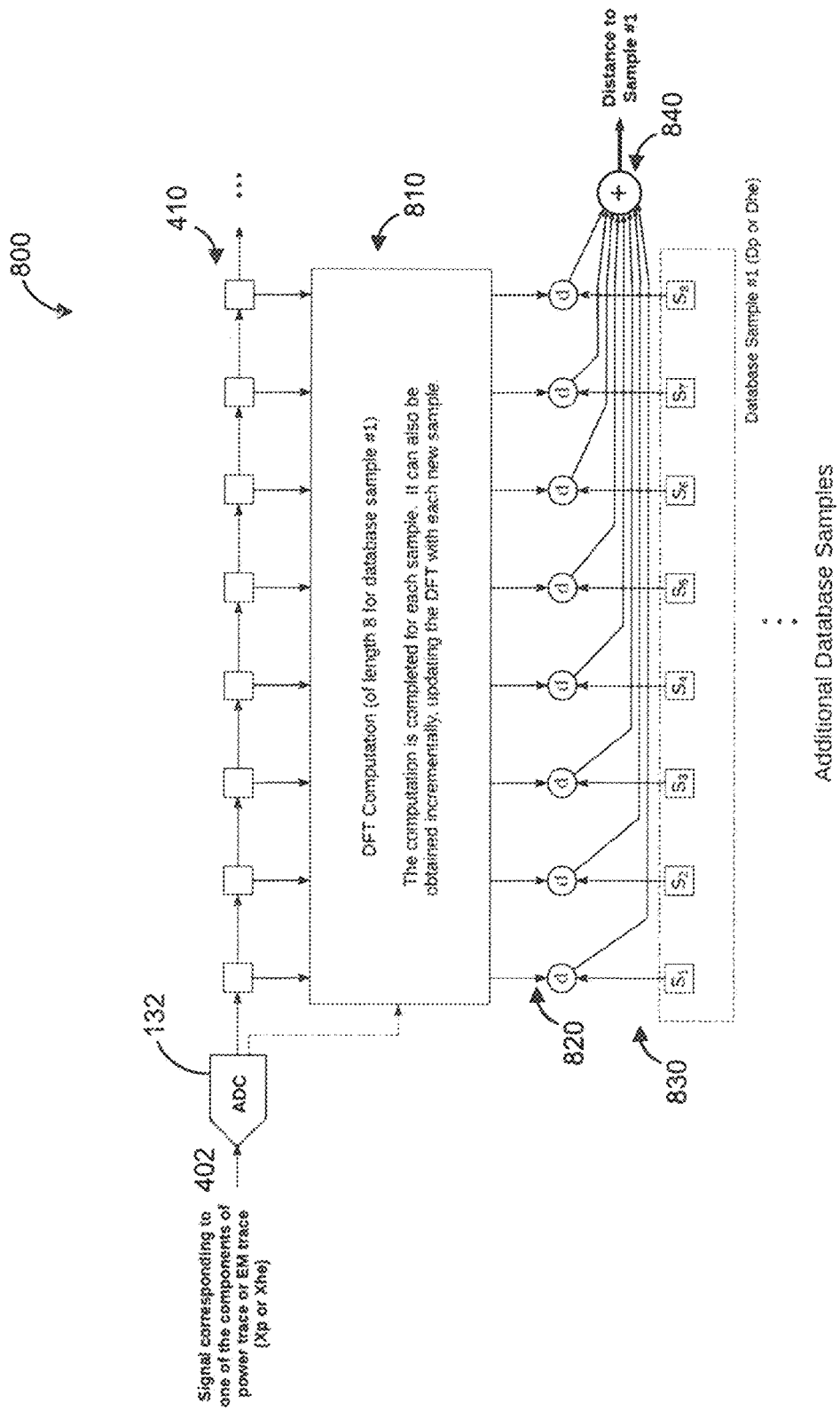
FIG. 8 is a diagram of an architecture for a comparator including pre-processing, in accordance with at least one embodiment.

Referring to FIG. 8, shown therein is a diagram of an architecture 800 for a comparator 150 including a pre-processor 810 in accordance with at least one embodiment. The pre-processor 810 can include any appropriate transformation.

In at least one embodiment, the pre-processor 810 can include a Discrete Fourier Transform (DFT). In at least one embodiment, the DFT can be computed through Fast Fourier Transform. In at least one embodiment, the DFT can be computed incrementally, by updating the DFT as a result of shifting the samples, eliminating the first sample and adding a new one. The resulting values can be expressed in a plurality of formats. In at least one embodiment, for example, the distance computation can receive the raw complex number and output the magnitude of the difference. In at least one embodiment, the distance computation can use the complex logarithm of each value, to compare the pairs <logarithmic magnitude, phase> in the Euclidean sense.

In at least one embodiment, the pre-processor 810 can include a dimensionality reduction derived from Principal Component Analysis (PCA) or other techniques.

Non-intrusive program tracing can allow for the reconstruction of a program trace of a deployed embedded device. In some embodiments, non-intrusive program tracing can also be used for software debugging at late stages of the development or even after deployment.

In some embodiments, non-intrusive program tracing can be implemented as a runtime monitor to enforce both safety and security properties of the device. In some embodiments, program tracing of a deployed embedded device can be used in an Intrusion Detection System (IDS) based on non-intrusive monitoring of the device's operation at a granularity level as fine as the program trace.

Figure 9:
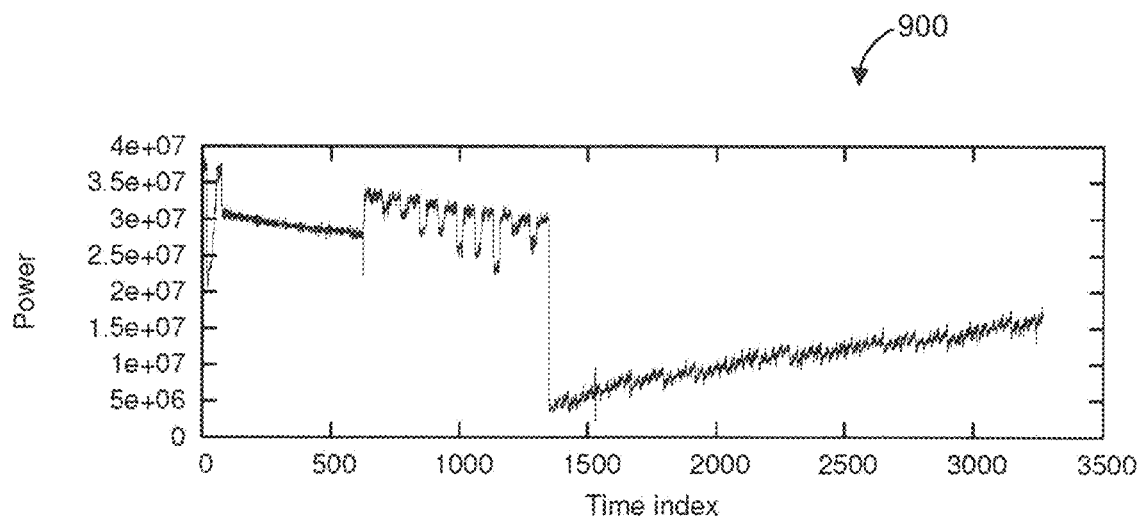
FIG. 9 is a screen shot of a power trace, in accordance with at least one embodiment.
Figure 10:
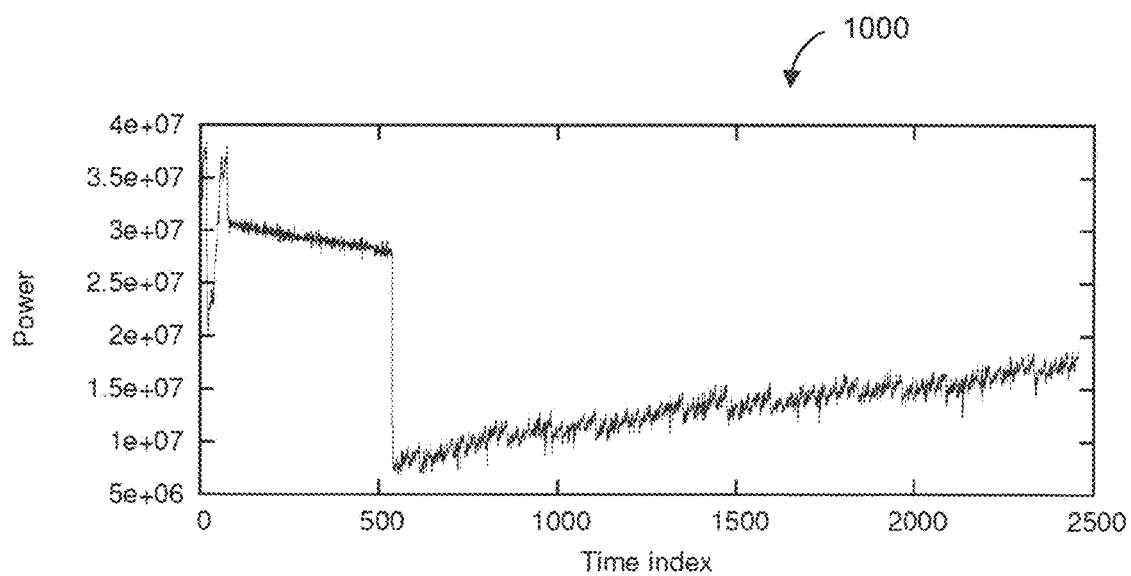
FIG. 10 is a screen shot of another power trace, in accordance with at least one embodiment.

Referring now to FIGS. 9 and 10, shown there are screenshots of power traces 900 and 1000, in accordance with at least one embodiment. A microprocessor may provide access control to other devices. The microprocessor can execute program code to grant access when a device is determined to be genuine, or deny access when a device is determined to not be genuine.

An IDS can monitor the power trace of the microprocessor. Power trace 900 shows the microprocessor as it executes program code for authenticating a genuine device at approximately time index 600-1400. In contrast, power trace 1000 shows the microprocessor as it fails the authentication and does not execute the program code related to authentication.

Numerous specific details are set forth herein in order to provide a thorough understanding of the exemplary embodiments described herein. However, it will be understood by those of ordinary skill in the art that these embodiments may be practiced without these specific details. In other instances, well-known methods, procedures and components have not been described in detail so as not to obscure the description of the embodiments. Furthermore, this description is not to be considered as limiting the scope of these embodiments in any way, but rather as merely describing the implementation of these various embodiments.

The invention claimed is:

1. A system for non-intrusive program tracing of a device comprising:
   (a) a detector operable to generate a program trace signal from at least one of power consumption and electromagnetic emission of the device, the program trace signal comprising an analog signal having a bandwidth;
   (b) a converter and a decomposer operable to digitize and decompose the program trace signal into at least two digital program trace component signals comprising a low frequency program trace component signal and one or more high frequency program trace component signals, each of the at least two digital program trace component signals having different frequency bands, the bandwidth of each program trace component signal being smaller than the bandwidth of the program trace signal, each of the one or more high frequency program trace component signals comprising an envelope of the program trace signal within the frequency band of that high frequency program trace component signal;
   (c) a database for storing a plurality of candidate samples, each candidate sample being associated with at least one of the known portion of program code and an observed behavior, each candidate sample comprising at least two candidate sample components having different frequency bands that correspond to the different frequency bands of the at least two digital program trace component signals;
   (d) a comparator in communication with the database, the comparator operable to collect fragments of the program trace signal and to determine for each fragment, a distance between the fragment and a candidate sample of the plurality of candidate samples, the distance between the fragment and the candidate sample comprises the distances between the at least two digital program trace component signals of the fragment and the candidate sample components of the candidate sample having the same frequency bands; and
   (e) a processor operable to, for each fragment:
      (i) determine if the distance between the fragments and the candidate sample satisfies a pre-determined criterion; and
      (ii) in response to determining that the pre-determined criterion is satisfied, classify the fragment as the at least one of a known portion of program code and an observed behavior of the device, otherwise determine that the fragment cannot be classified.

2. The system of claim 1, wherein:
   (a) the decomposer decomposes the program trace signal into at least two analog program trace component signals; and
   (b) the converter digitizes the at least two analog program trace component signals to provide the at least two digital program trace component signals.

3. The system of claim 1, wherein:
   (a) the converter digitizes the program trace signal into a digital program trace signal; and
   (b) the decomposer decomposes the digital program trace signal to provide the at least two digital program trace component signals.

4. The system of claim 1, wherein the database stores the at least two candidate sample components of each candidate sample.

5. The system of claim 1, wherein the decomposer is further configured to decompose the plurality of candidate samples to provide the at least two candidate sample components of each candidate sample.

6. The system of claim 1, wherein:
   (a) the frequency band of the low frequency program trace component signal being defined by at least a first pre-determined frequency;
   (b) a frequency band of the one or more high frequency program trace component signals being defined by at least a second pre-determined frequency; and
   (c) the decomposer comprises:
      (i) a first low pass filter for generating the low frequency program trace component signal from the program trace signal, the low frequency program trace component signal having frequencies below the first pre-determined frequency threshold;
      (ii) a high pass filter for generating a first intermediate program trace component signal from the program trace signal, the first intermediate program trace component signal having frequencies above the second pre-determined frequency threshold; and
      (iii) a first envelope processor for generating a first high frequency program trace component signal, the first high frequency program trace component signal comprising an envelope of the first intermediate program trace component signal.

7. The system of claim 6, wherein the first envelope processor comprises a rectifier and at least one of a group comprising a second low pass filter having the second pre-determined frequency threshold, an envelope detector, and a root-mean-square (RMS) detector.

8. The system of claim 6, wherein:
   (a) the at least two digital program trace component signals further comprise a second high frequency program trace component signal having a second high frequency band, the second high frequency band being defined by at least a third pre-determined frequency and either the first pre-determined frequency or the second pre-determined frequency; and
   (b) the decomposer further comprises:
      (i) either a third low pass filter or a second high pass filter for generating a second intermediate program trace component signal from either:
         a. the low frequency program trace component signal when the second high frequency band is defined by the first pre-determined frequency, or
         b. the first intermediate program trace component signal when the second high frequency band is defined by the second pre-determined frequency; and (ii) a second envelope processor for generating the second high frequency program trace component signal, the second high frequency program trace component signal comprising an envelope of the second intermediate program trace component signal.

9. The system of claim 1, wherein the processor is operable to use machine learning model to determine whether fragments of the program trace signal can be classified as at least one of a known portion of program code and an observed behavior of the device.

10. A method for non-intrusive program tracing a device comprising:
   (a) generating a program trace signal from at least one of power consumption and electromagnetic emission of the device, the program trace signal comprising an analog signal having a bandwidth;
   (b) digitizing and decomposing the program trace signal into at least two digital program trace component signals comprising a low frequency program trace component signal and one or more frequency program trace component signals, each of the at least two digital program trace component signals having different bands, the bandwidth of each program trace component signal being smaller than the bandwidth of the program trace signal, each of the one or more high frequency program trace component signals comprising an envelope of the program trace signal within the frequency band of that high frequency program trace component signal;
   (c) storing a plurality of candidate samples, each of the candidate samples being associated with the at least one of a known portion of program code and an observed behavior;
   (d) collecting fragments of the program trace signal; and
   (e) for each fragment,
      (i) determining a distance between the program trace signal and a candidate sample of the plurality of candidate samples, the distance between the program trace signals and the candidate sample comprises the distances between the at least two digital program trace component signals of the fragment and the candidate sample components of the candidate sample having the same frequency bands;
      (ii) determining if the distance between the fragment and the candidate sample satisfies a pre-determined criterion; and
      (iii) in response to determining that the pre-determined that the pre-determined criterion is satisfied, classifying the fragment as the at least one of a known portion of program code and an observed behavior of the device, otherwise determining that the fragment cannot be classified.

11. The method of claim 10, wherein digitizing and decomposing the program trace signal into at least two digital program trace component signals comprises:
   (a) decomposing the program trace signal into at least two analog program trace component signals; and
   (b) digitizing the at least two analog program trace component signals to provide the at least two digital program trace component signals.

12. The method of claim 10, wherein digitizing and decomposing the program trace signal into at least two digital program trace component signals comprises:
   (a) digitizing the program trace signal into a digital program trace signal; and
   (b) decomposing the digital program trace signal to provide the at least two digital program trace component signals.

13. The method of claim 10, wherein storing a plurality of candidate samples comprises storing the at least two candidate sample components of each candidate sample.

14. The method of claim 10, further comprising decomposing the plurality of candidate samples to provide the at least two candidate sample components of each candidate sample.

15. The method of claim 10, wherein:
   (a) the frequency band of the low frequency program trace component signal being defined by at least a first pre-determined frequency;
   (b) a frequency band of the one or more high frequency program trace component signal being defined by at least a second pre-determined frequency; and
   (c) digitizing and decomposing the program trace signal into the at least two digital program trace component signals comprises:
      (i) filtering frequencies above the first pre-determined frequency threshold from the program trace signal to provide the low frequency program trace component signal having frequencies below the first pre-determined frequency threshold;
      (ii) filtering frequencies below the second pre-determined frequency threshold from the program trace signal to provide a first intermediate program trace component signal having frequencies above the second pre-determined frequency threshold; and
      (iii) generating a first high frequency program trace component signal comprising an envelope of the first intermediate program trace component signal.

16. The method of claim 15, wherein generating the second program trace component signal comprises rectifying the first intermediate program trace component signal and detecting the envelope of the rectified first intermediate program trace component signal.

17. The method of claim 15, wherein:
   (a) the at least two digital program trace component signals further comprise a second high frequency program trace component signal having a second high frequency band being defined by at least a third pre-determined frequency and either the first pre-determined frequency or the second pre-determined frequency; and
   (b) digitizing and decomposing the program trace signal into the at least two digital program trace component signals further comprises:
      (iii) either:
         a. filtering frequencies below the third pre-determined frequency from the first intermediate program trace component signal to provide the second intermediate program trace component signal; or
         b. filtering frequencies above the third pre-determined frequency from the first intermediate program trace component signal or the low frequency program trace component to provide the second intermediate program trace component signal; and
      (iv) generating the second high frequency program trace component signal comprising an envelope of the second intermediate program trace component signal.

18. The method of claim 10 comprises using a machine learning model for determining whether the fragments of the program trace signal can be classified as at least one of a known portion of program code and an observed behavior of the device.

* * * * *

UNITED STATES PATENT AND TRADEMARK OFFICE
CERTIFICATE OF CORRECTION

PATENT NO. : 11,119,127 B2
APPLICATION NO. : 16/051574
DATED : September 14, 2021
INVENTOR(S) : Carlos Moreno and Sebastian Fischmeister It is certified that error appears in the above-identified patent and that said Letters Patent is hereby corrected as shown below:

In the Claims

Claim 1, Column 17, Line 60:
"the fragments"
Should read -- the fragment --

Claim 10, Column 19, Line 49-50:
"determining that the pre-determined that the pre-determined criterion"
Should read -- determining that the pre-determined criterion --

Signed and Sealed this
Sixteenth Day of July, 2024

Katherine Kelly Vidal
*Director of the United States Patent and Trademark Office*